(12) United States Patent
Cha et al.

(10) Patent No.: US 6,242,798 B1
(45) Date of Patent: Jun. 5, 2001

(54) STACKED BOTTOM LEAD PACKAGE IN SEMICONDUCTOR DEVICES

(75) Inventors: Gi-Bon Cha, Cheongju; Byeong-Duck Lee, Seoul, both of (KR)

(73) Assignee: Hyundai Electronics Industries Co., Ltd., Ichon-shi (KR)

( * ) Notice: Subject to any disclaimer, the term of this patent is extended or adjusted under 35 U.S.C. 154(b) by 0 days.

(21) Appl. No.: 09/515,626

(22) Filed: Feb. 29, 2000

Related U.S. Application Data

(62) Division of application No. 08/974,684, filed on Nov. 19, 1997, now Pat. No. 6,030,858.

(30) Foreign Application Priority Data

Nov. 22, 1996 (KR) .................................................. 96-56252
Oct. 28, 1997 (KR) .................................................. 97-55467

(51) Int. Cl.[7] .................................................. H01L 23/495
(52) U.S. Cl. .................... 257/673; 257/696; 257/686; 257/698; 257/796; 257/784
(58) Field of Search .................................. 257/686, 685, 257/673, 690, 692, 693, 696, 698, 723, 730, 777, 684, 796, 712

(56) References Cited

U.S. PATENT DOCUMENTS

| | | | |
|---|---|---|---|
| 4,553,420 | | 11/1985 | Fierkens et al. ........................ 72/380 |
| 5,362,656 | * | 11/1994 | McMahon ............................ 257/781 |
| 5,363,279 | | 11/1994 | Cha ..................................... 361/767 |
| 5,446,620 | | 8/1995 | Burns et al. .......................... 361/704 |
| 5,554,886 | * | 9/1996 | Song .................................... 257/646 |
| 5,744,827 | * | 4/1998 | Jeong et al. .......................... 257/686 |
| 5,801,439 | | 9/1998 | Fujisawa et al. ..................... 257/686 |
| 5,821,615 | * | 10/1998 | Lee ....................................... 257/686 |
| 5,952,717 | * | 9/1999 | Taniguchi et al. ................... 257/734 |
| 5,986,209 | * | 11/1999 | Tandy .................................. 257/686 |
| 6,002,167 | * | 12/1999 | Hatano et al. ....................... 257/696 |
| 6,013,948 | * | 1/2000 | Akram et al. ........................ 257/698 |
| 6,026,629 | * | 2/2000 | Farnworth et al. .................. 257/686 |

* cited by examiner

Primary Examiner—Alexander O. Williams
(74) Attorney, Agent, or Firm—Fleshner & Kim, LLP

(57) ABSTRACT

A stacked bottom lead package for use in semiconductor devices includes leads that are bent along with the circumference of the body which has been premolded, wherein a chip is included inside the premolded body. The package configuration prevents solder fatigue of the lead due to heat carried via the extended lead and emitted out of the chip and decreases the area required for stacking semiconductor packages.

14 Claims, 25 Drawing Sheets

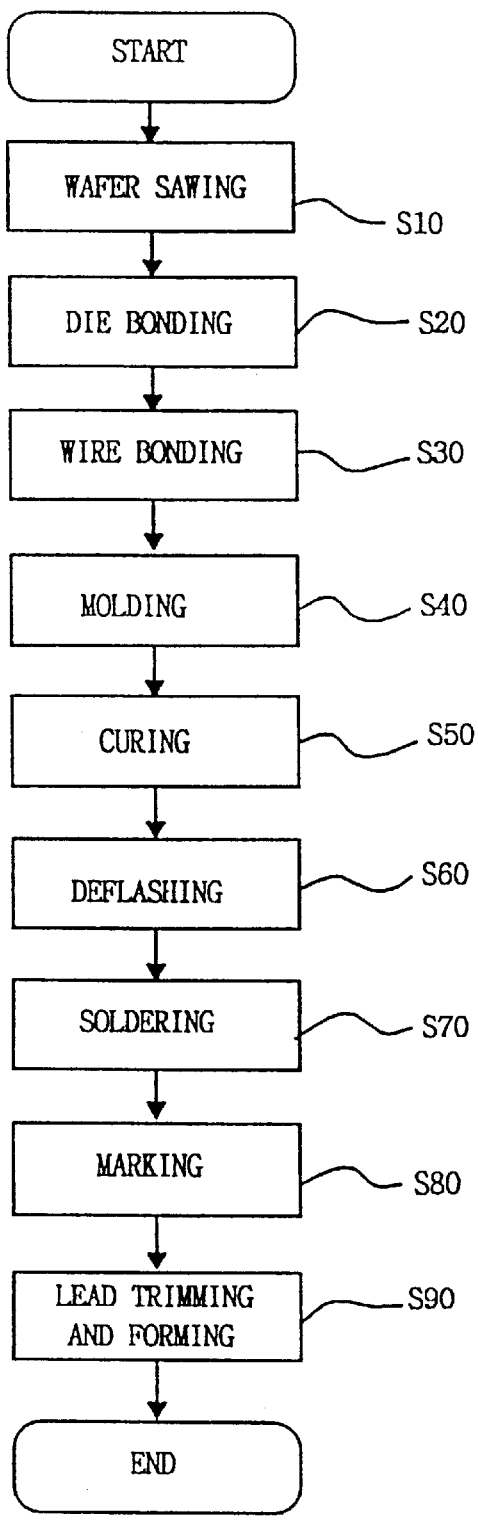

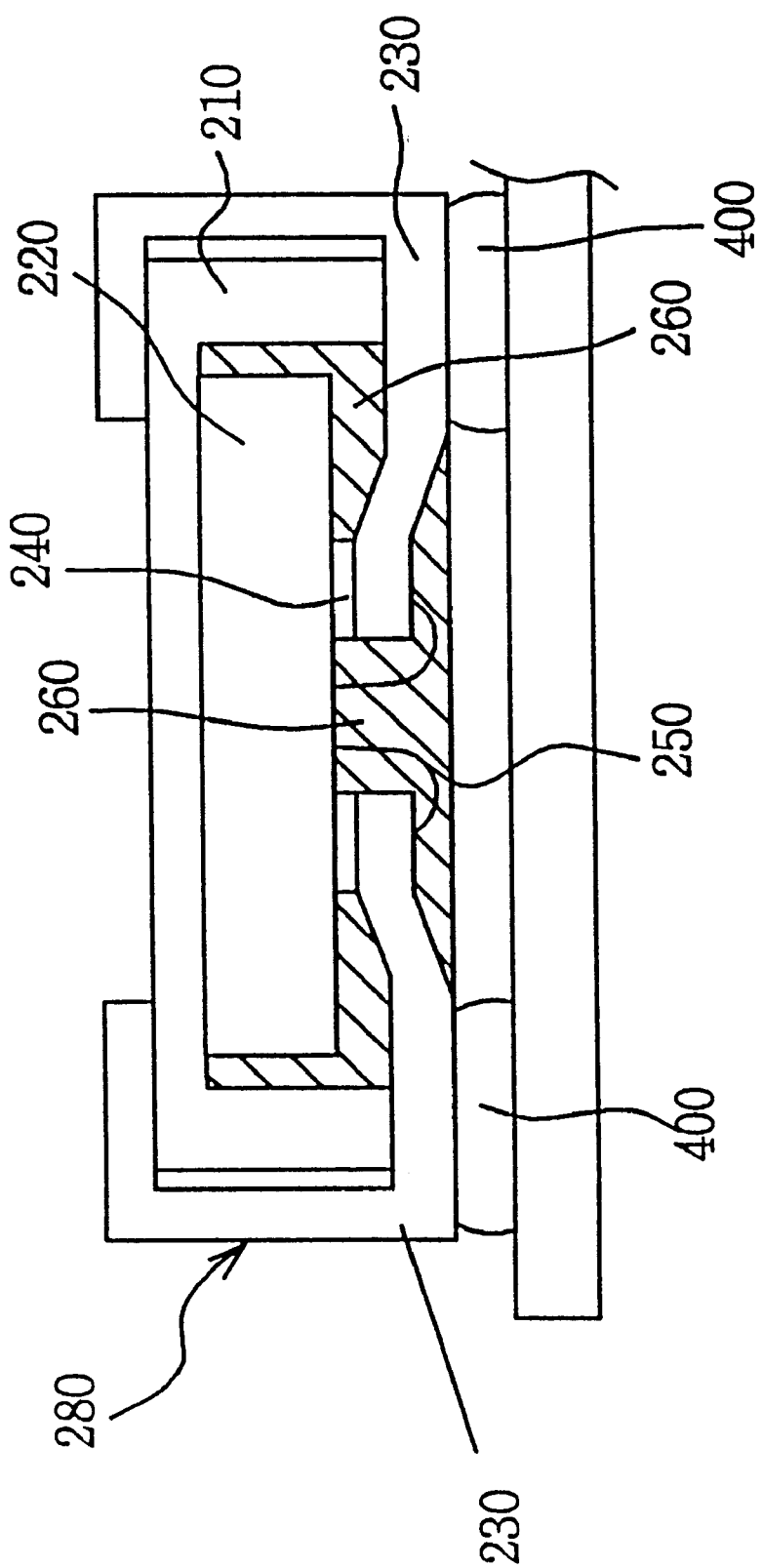

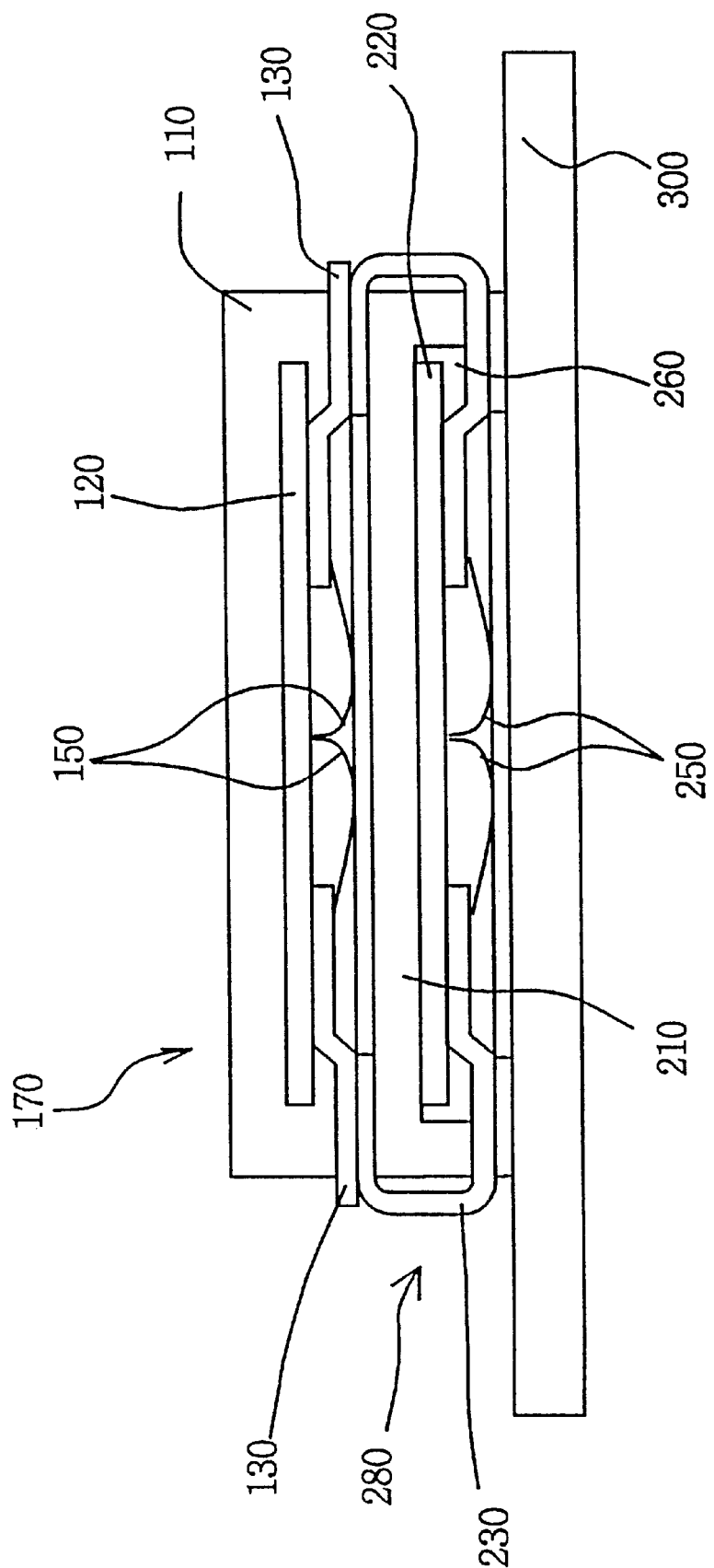

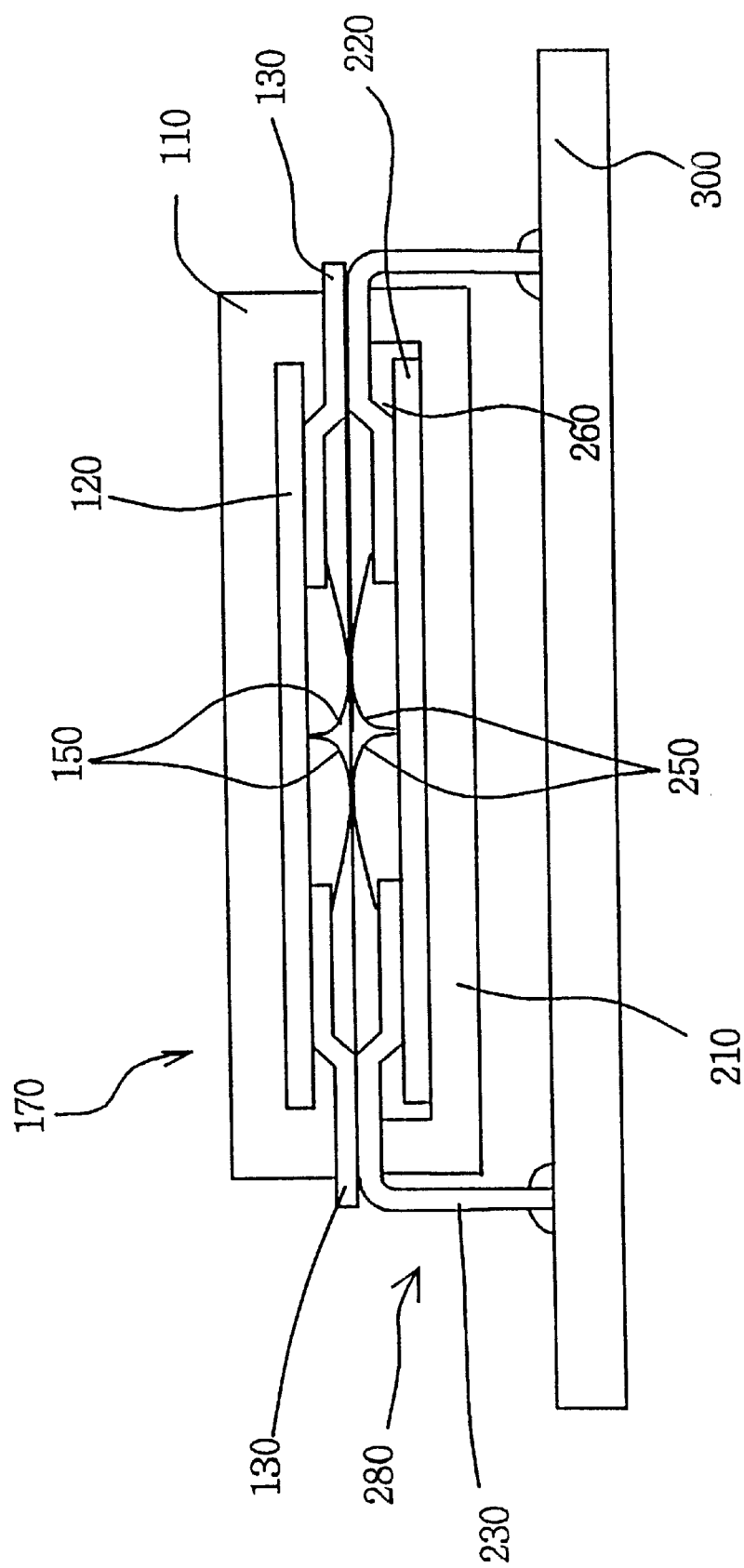

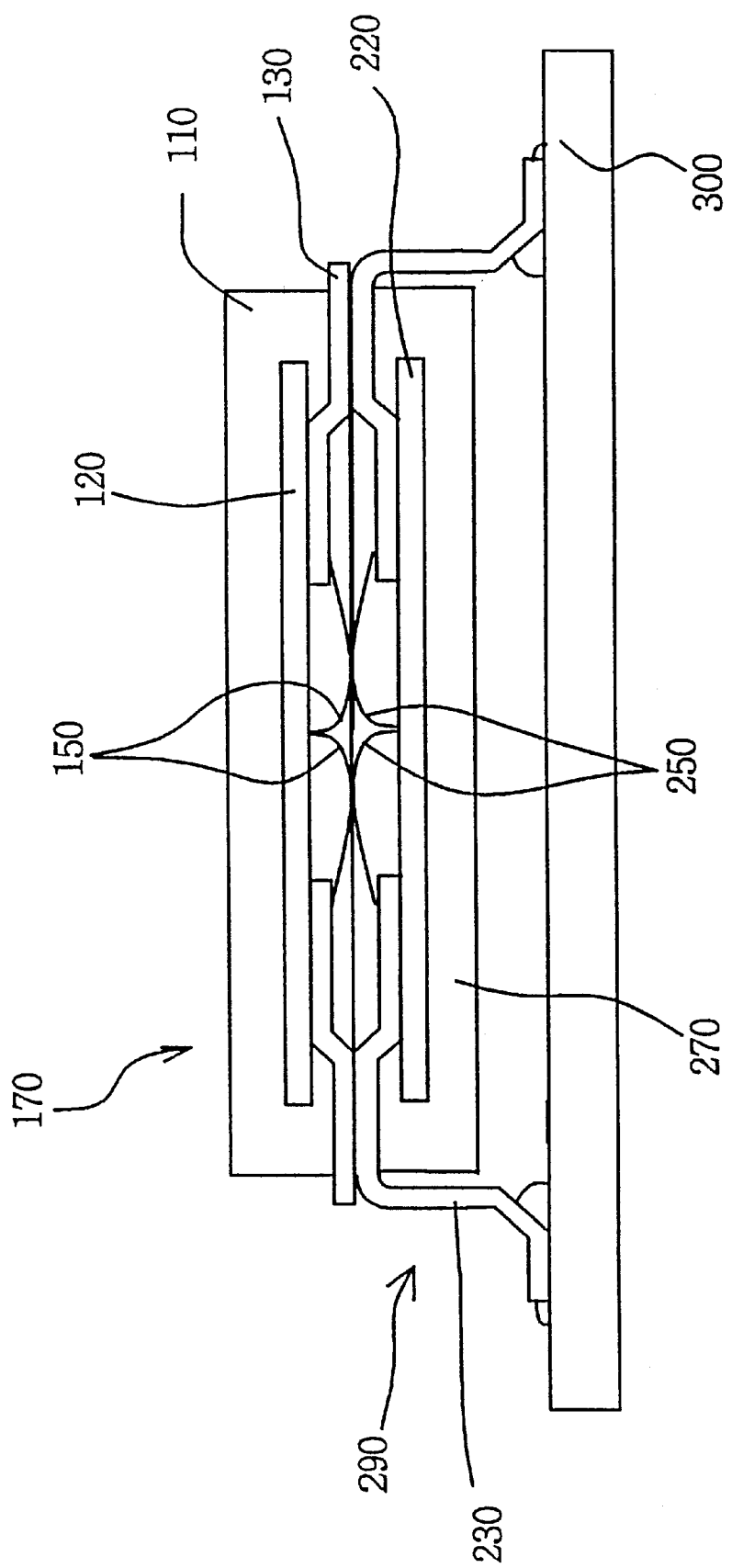

STACKED BOTTOM LEAD PACKAGE IN SEMICONDUCTOR DEVICES

This application is a divisional of Ser. No. 08/974,684 filed Nov. 19, 1997, U.S. Pat. No. 6,030,858.

BACKGROUND OF THE INVENTION

1. Field of Invention

The present invention relates to a stacked bottom lead package in semiconductor devices and a method thereof. More specifically, comprising leads that are bent along with the circumference of the body which has been premolded wherein a chip is included inside the premolded body, the package and the method thereof according to the present invention enable a dual process and keep the solder fatigue of the lead from the heat carried via the extended lead and emitted out of the chip and decrease area required for stacking semiconductor packages.

In general, a bottom lead semiconductor package BLP type has leads lie at the bottom of the package body. A method of coupling the leads is Lead On Chip LOC, in which leads have been connected to the chip and then fixed to the chip by molding them simultaneously.

2. Discussion of Related Art

FIG. 1 shows a cross-sectional view of the bottom lead package according to the background art.

The conventional BLP consists of leads 130 fixed to the surface of a semiconductor chip 120 with an adhesive tape 140, input/output pads of the chip 120, leads 130 and bonding wires 150 wherein the portion of the inner leads of the leads 130 and the input/output pads of the chip 120 are connected electrically each other, and a molded part 110 including the bonding wire 150 and having been formed by means of pouring epoxy resin into it.

As a portion of the leads 130, outer leads are disclosed under the bottom of the molded part 110 and the bottom of the molded part 110 and the surface of the leads are located at the same plane, the BLP is mounted on a printed circuit board at which the disclosed portion of the leads 130 are soldered.

FIG. 2 is a flow chart showing the process of fabricating the BLP according to the background art.

As is shown in FIG. 2, the conventional process of fabricating the BLP comprises the steps of separating a wafer including a plurality of chips into each chip by means of cutting the wafer S10, a die bonding fixing the separated chip to a paddle of a lead frame S20, a wire bonding S30 connecting electrically the chip to the leads with bonding-wires between the input/output pads and the leads, a molding S40 forming a molded part in which the wire-bonded chip and the leads are coupled with each other in use of an epoxy resin, hardening the molded body S50, a grinding S60 eliminating the epoxy molding compound which has remained at the disclosed leads in the molding step, a plating S70 soldering the disclosed leads with protecting materials, a marking S80 giving an identification factor on a surface of the molded part, a lead trimming and a forming S90 which are eliminating an unnecessary portion of the leads out of the molded part and bending the leads according to a defined pattern, respectively.

FIG. 3A to FIG. 3B show variations of formed leads to stack semiconductor packages.

In FIG. 3A, a TSOP typed semiconductor package is formed by means of making outer leads of the upper stacked semiconductor package longer than those of the lower stacked semiconductor package.

In FIG. 3B, the leads of the stacked semiconductor packages are coupled with connecting bars 160.

The conventional BLP has been troubled with the fatigue occurring on account of the heated solder formed on the surface of the leads wherein the heating is caused by the heat emitted out of the chip and carried via leads, and the poor durability of the semiconductor resulted from the micro gap that has been caused by the shock of cutting the leads on account of the short distance between the leads and the molded part.

And the conventional method of fabricating a BLP has problems in time consuming on the whole process in con-secutive order such as a process after another, and in additive process of grinding the leads to eliminate the epoxy molding compounds that has remained at the leads in molding.

Moreover, in stacking the semiconductor packages according to the conventional method, the interfaces between the outer leads protrude outward and lead bars are necessary for connecting each lead together, causing the increase of mounting area and the increased height of stacking the semiconductor packages due to the insufficient contacts between the interfaces of the leads.

The above references are incorporated by reference herein where appropriate for appropriate teachings of additional or alternative details, features and/or technical background.

SUMMARY OF THE INVENTION

The present invention is intended to overcome the above problems in stacked bottom lead package in semiconductor devices.

Therefore, it is an object of the present invention to provide a shortened processing time and a decreased solder fatigue, wherein the processing time is shortened by means of the dual processes in which an independent process for forming a premolded body from the main process is executed and the solder fatigue is decreased by means of having a distance between the leads and the chip enough to keep the heat of the chip from being carried and bending the leads along with the circumference of the premolded body.

Another object of the present invention is to provide general semiconductor packages having various types of leads and a minimized area and height required for stacking semiconductor packages by means of elongating the leads around the portion of the body of the semiconductor package to increase contacting areas.

In achieving the above object, the present invention comprises a chip having a plurality of input/output pads, a body sealing up the body, a plurality of leads having one end of each lead connected to a plurality of the chip, having the other end of each lead protrude out of a front face of the body and extend to a back face of the body, at least lying closely on a front face and a lateral face of body and a material fixing a plurality of the leads to the chip.

And a method to provide the present invention comprises fixing one end of each lead to a semiconductor chip, connecting a plurality of pads of the chip respectively to the one end of said each lead with a plurality of wires, forming a body embracing the chip and the one end of the each lead by means of molding with resin wherein a portion of the each lead is disclosed toward same direction of front faces of a plurality of the pads of the chip having the same direction of a front face of the body, and bending the other end of the each lead extending to a back face of the body.

And also stacked semiconductor packages comprises a first unit package including a chip having a plurality of leads, a body sealing up the chip, a plurality of leads having one end of each the lead connected to a plurality of the chip, having the other end of each lead protrude out of a front face of the body and extend to a back face of the body, at least lying closely on a front face and a lateral face of the body, and a material fixing a plurality of the leads to the chip, and a second unit package having a plurality of leads connected electrically to a plurality of the leads of the first unit package, stacked on the first unit package.

Additional advantages, objects, and features of the invention will be set forth in part in the description which follows and in part will become apparent to those having ordinary skill in the art upon examination of the following or may be learned from practice of the invention. The objects and advantages of the invention may be realized and attained as particularly pointed out in the appended claims.

BRIEF DESCRIPTION OF THE ATTACHED DRAWINGS

The invention will be described in detail with reference to the following drawings in which like reference numerals refer to like elements wherein:

FIG. 2 shows a method of fabricating BLP according to the background art.

FIG. 5A and FIG. 5B are variations of the BLP according to the present invention to be mounted on a printed circuit board.

FIG. 6A to FIG. 6H show variations of stacked semiconductor packages according to the present invention.

FIG. 7A to FIG. 7H show other variations of stacked semiconductor packages according to the present invention.

DETAILED DESCRIPTION OF PREFERRED EMBODIMENT

Stacked bottom lead packages according to embodiments of the present invention will be described with reference to the attached drawings.

Figure 1:
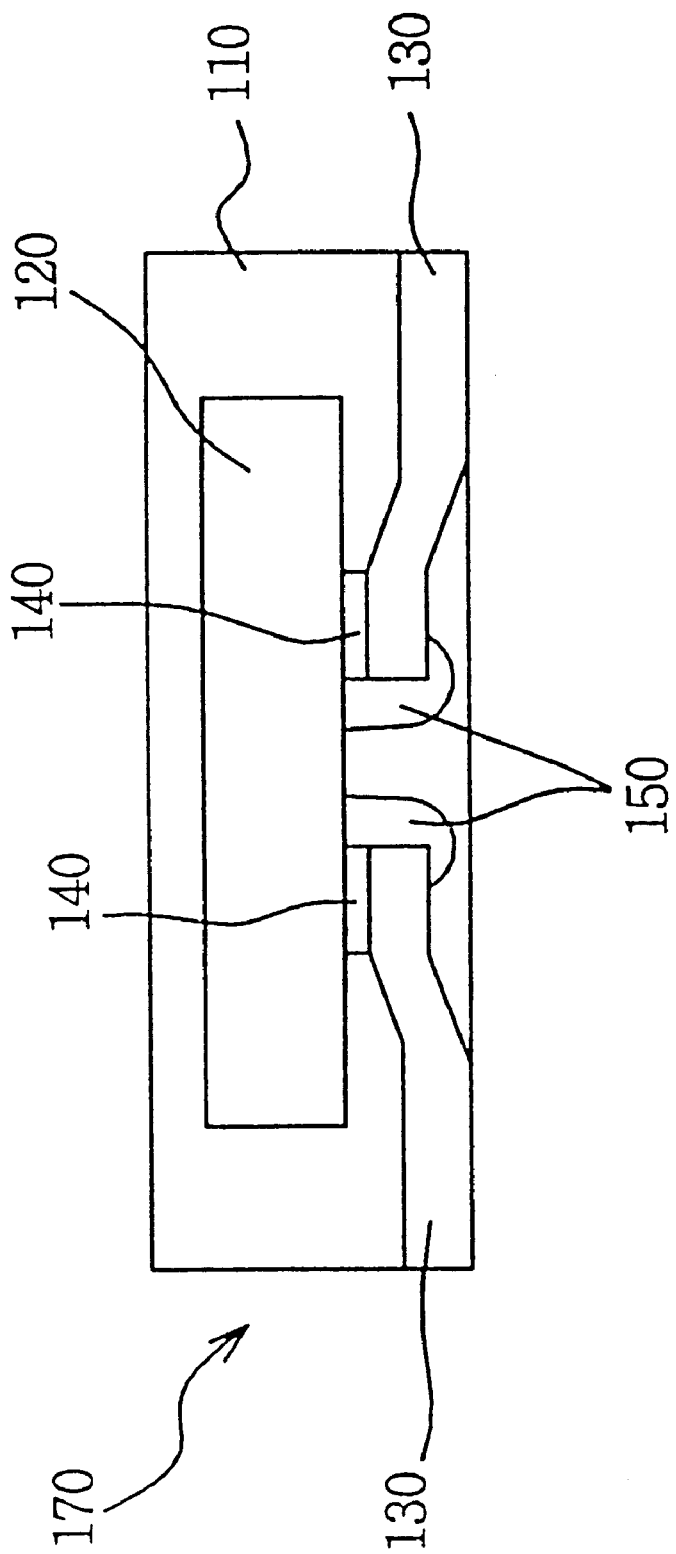
FIG. 1 shows a cross-sectional view of the BLP according to the background art.
Figure 3A:
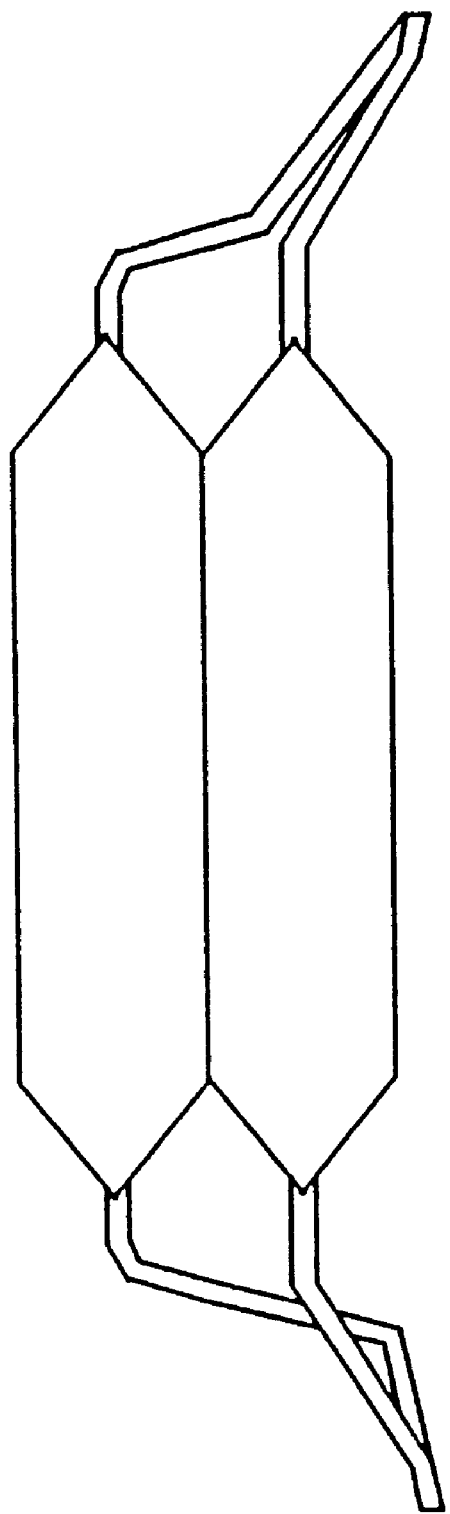
FIG. 3A to FIG. 3B show variations of stacked semiconductor packages according to the background art.
Figure 3B:
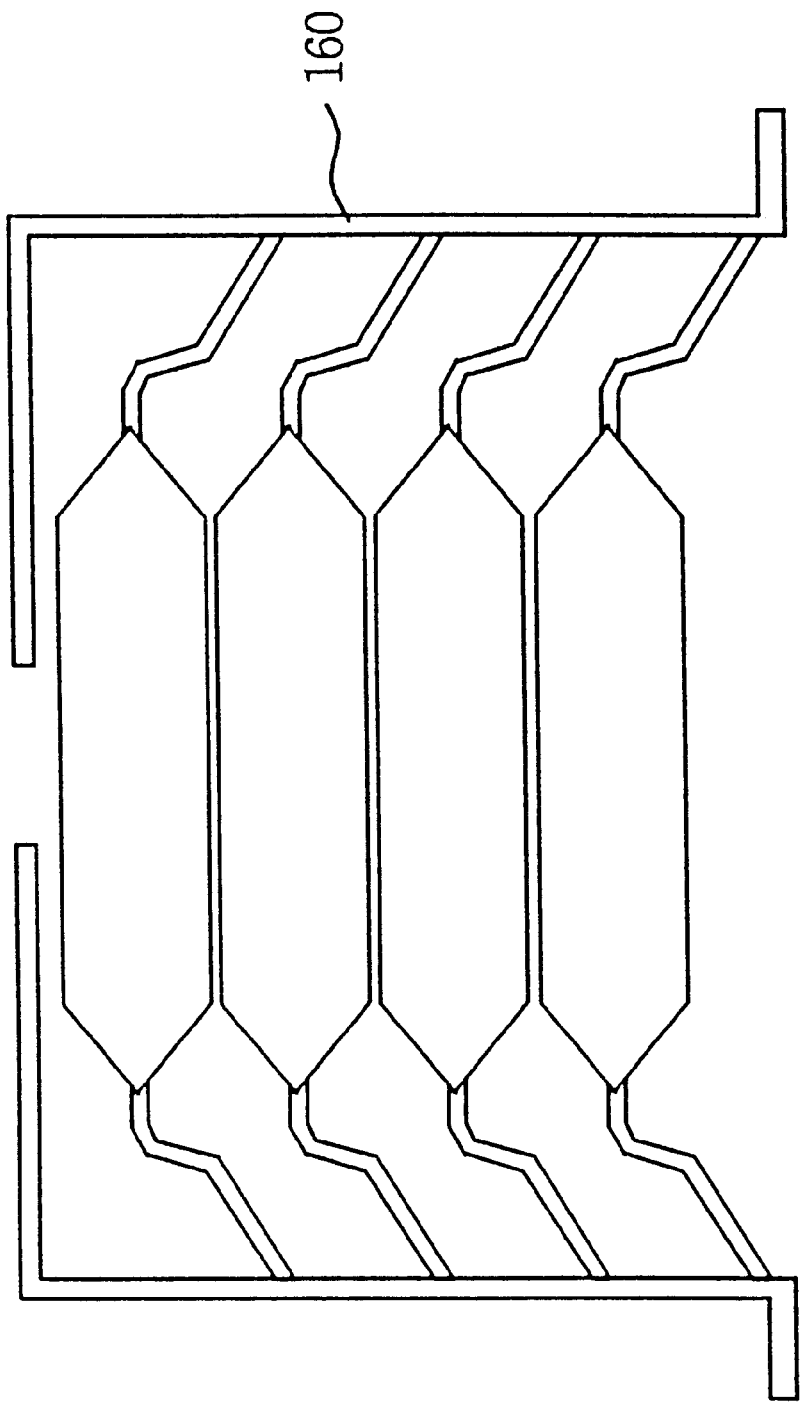
Figure 4A:
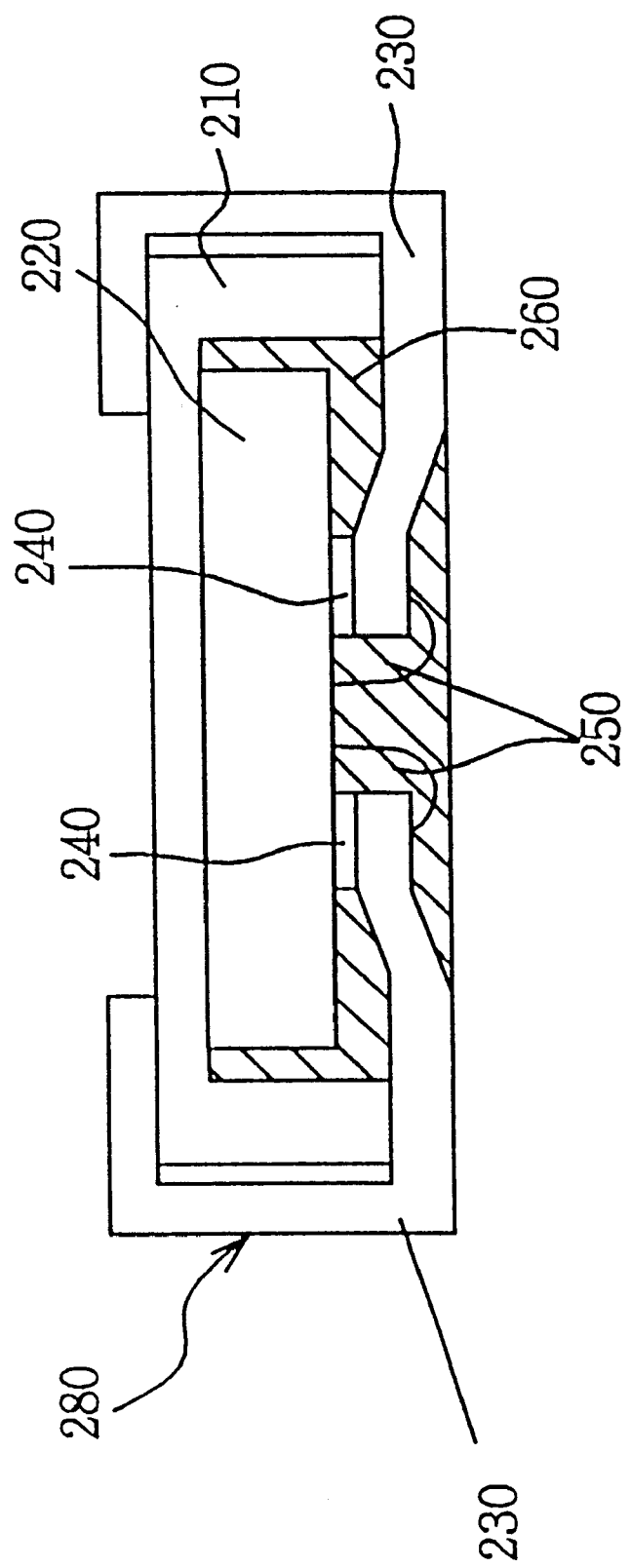
FIG. 4A and FIG. 4B show cross-sectional views of the BLP according to the present invention.
Figure 4B:
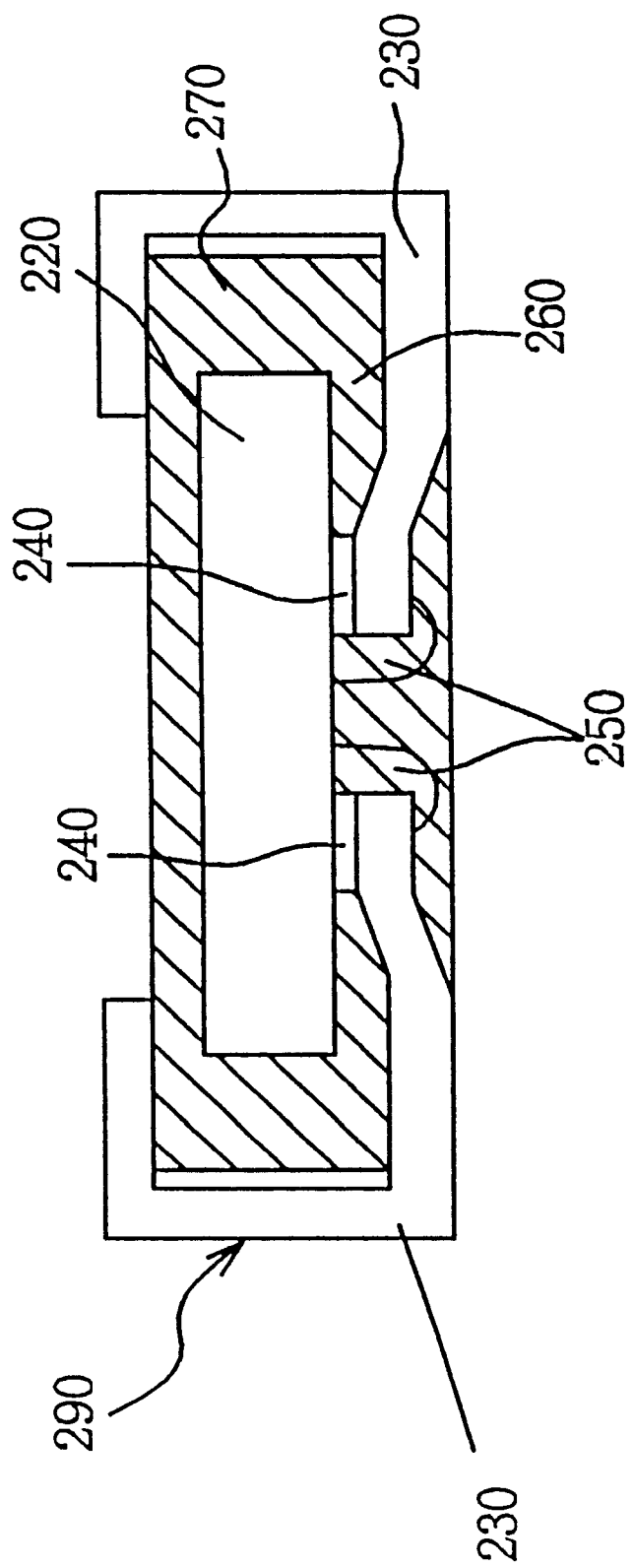

FIG. 4A and FIG. 4B show cross-sectional views of the BLP according to the present invention.

In FIG. 4A, a body 210 is formed by means of hardening resin that has been injected into a mold with a dual process separated from a main process.

At the bottom face of an inside of the body 210, a plurality of leads 230 are fixed to a chip 220 with an adhesive tape 240 and each lead 230 is connected electrically to a corresponding input/output pad of the chip 220 by means of wire-bonding.

And a filled part 260 is formed by means of injecting epoxy resin into the inner space of the body 210 to seal it up, in which the chip 220 and the leads 230 are embraced. Disclosed portions of the leads 230 out of the body 210 are bent along with the surface of the body, particularly from the bottom of the body via the lateral face of the body to the upside of the body.

Another BLP typed semiconductor package according to the present invention is shown in FIG. 4B, wherein a plurality of leads 230 are fixed to a chip 220 with an adhesive tape and each input/output terminal formed in the chip 220 is connected electrically to the corresponding lead 230 with a corresponding wire 250 by means of wire-bonding.

A molded part 270 shaped with epoxy resin is formed around the circumference of the chip 220 and the leads 230 are elongated to be bent from the bottom of the molded part 270 via the lateral face of the molded part 270 to the upside of the molded part 270, thereby the BLP typed semiconductor package is formed.

Figure 5B:
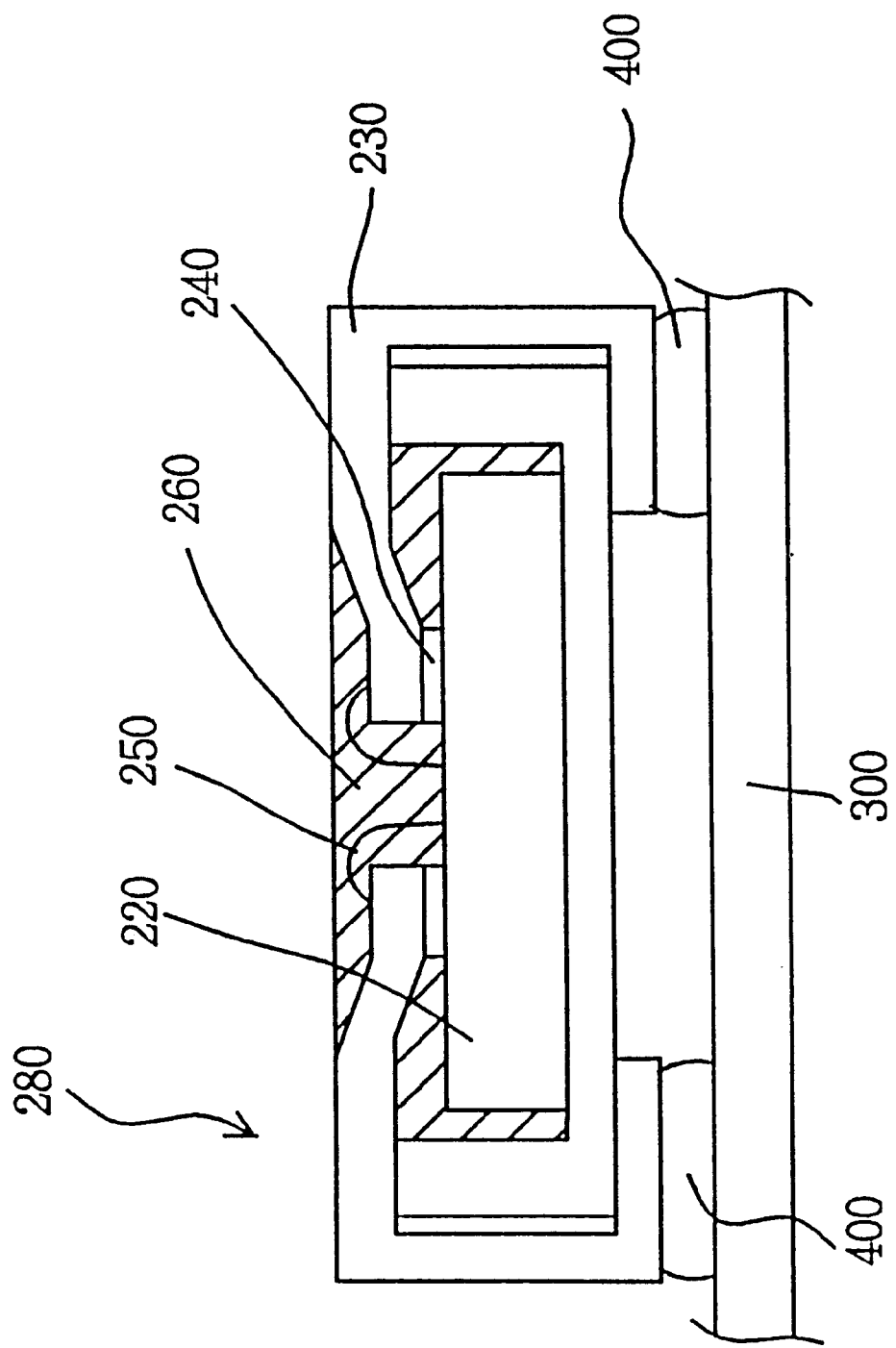

FIG. 5A and FIG. 5B are variations of the BLP according to the present invention to be mounted on a printed circuit board.

In FIG. 5A, the upper face, in which portions of the leads 230 in the BLP 280 are molded by filling epoxy resin into the filled part 260, is facing downward.

In FIG. 5B, the upper face faces upward and each lead is mounted on a printed circuit board 300.

FIG. 6A to FIG. 6H show variations of embodiments for stacking BLP according to the present invention.

Referring to FIG. 4A, the BLP according to the present invention has leads 230 bent around the circumference of the body 210, i.e. from the upper side to the downside.

Accordingly, the BLP 280 is mounted on the printed circuit board 300 when the molded part of the BLP 280 faces downward, i.e. in reversed state, or the molded part of it 280 is mounted upward i.e. in front state on the printed circuit board, thereby the leads of the semiconductor package formed by different method enable to be contacted each other on stacking the packages.

Stacked over the conventional semiconductor package, the BLP 280 according to the present invention provides the lowest stacked height by means of minimizing the whole area required for mounting and placing the reciprocal contacting interfaces at the same plane wherein the lateral faces of the contacting interfaces of the leads are perpendicular to themselves to control the appearance of the protruding parts in order to minimize a space needed for each lead.

Embodiments for stacking the BLP formed according to the present invention are explained with reference to FIG. 6A to FIG. 7H.

Embodiment 1

In FIG. 6A, the first embodiment according to the present invention comprises a conventional BLP 170 being placed on a BLP 280 according to the present invention, a body 210 having been premolded, extended leads 230, and a printed circuit board 300 wherein the BLP 280 is mounted on the printed circuit board 300 in the reversed state and the BLP 170 and the BLP 280 are stacked on each lead's being contacted reciprocally.

The leads 130 of the conventional BLP 170 located at the upper part is short, connected to the leads 230 extended to the back face of the BLP 280 according to the present invention.

Accordingly, the interval between the BLP's 170, 180 is minimized by means of contacting closely each face of the leads 130 to each lead 230 extended to the back face of the BLP 280 according to the present invention.

Embodiment 2

Figure 6B:
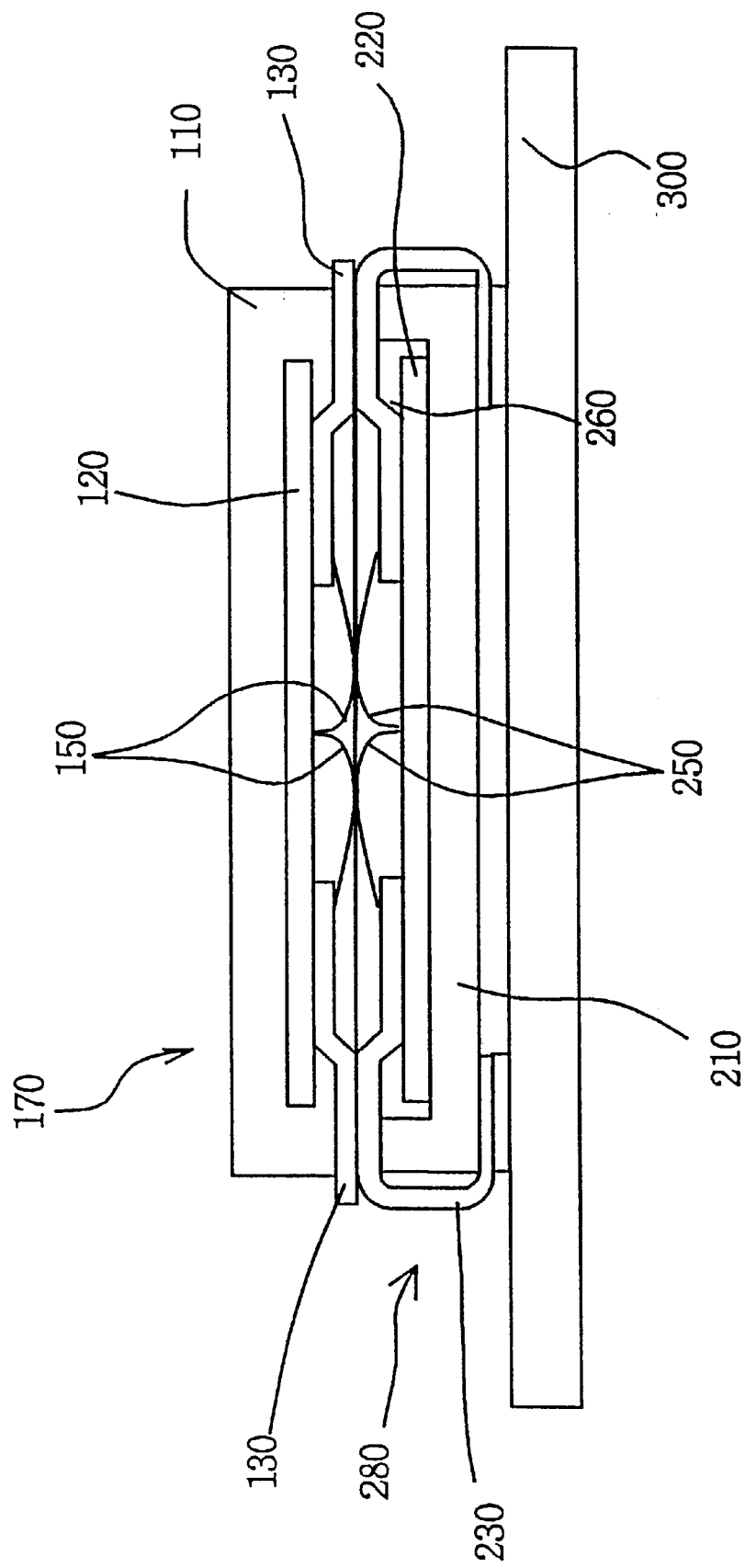

In FIG. 6B of the second embodiment of the present invention, a conventional BLP 170 having leads only on its front face locates on a BLP 280 according to the present invention wherein the BLP 280 having a premolded body 210 locates at the lower part as a unit package and is mounted on the printed circuit board 300 in the front state, in which the BLP's are stacked with their leads being contacted face to face.

Embodiment 3

Figure 6C:
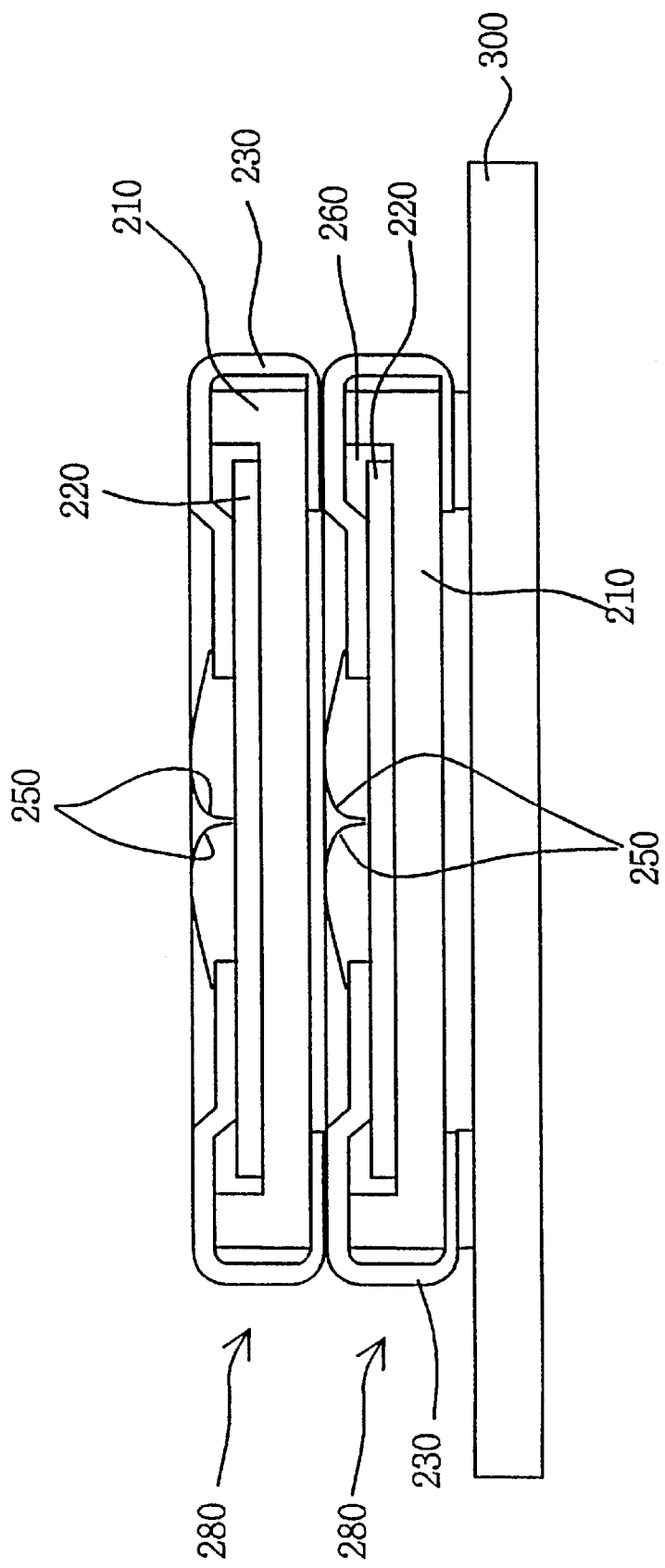

In FIG. 6C of the third embodiment 3, a BLP 280 having a premolded body 210 according to the present invention as a unit package is stacked over the other BLP 280 in the front state, and also the outer leads connected to one another are able to be stacked over in the reversed state as well, wherein the leads 230 extended from the front face via the lateral face to the back face of each BLP are contacted closely.

Moreover, FIG. 6D to FIG. 6H show desirable embodiments of the stacked BLP according to the present invention having the tips of the outer leads modified variously.

Embodiment 4

Figure 6D:
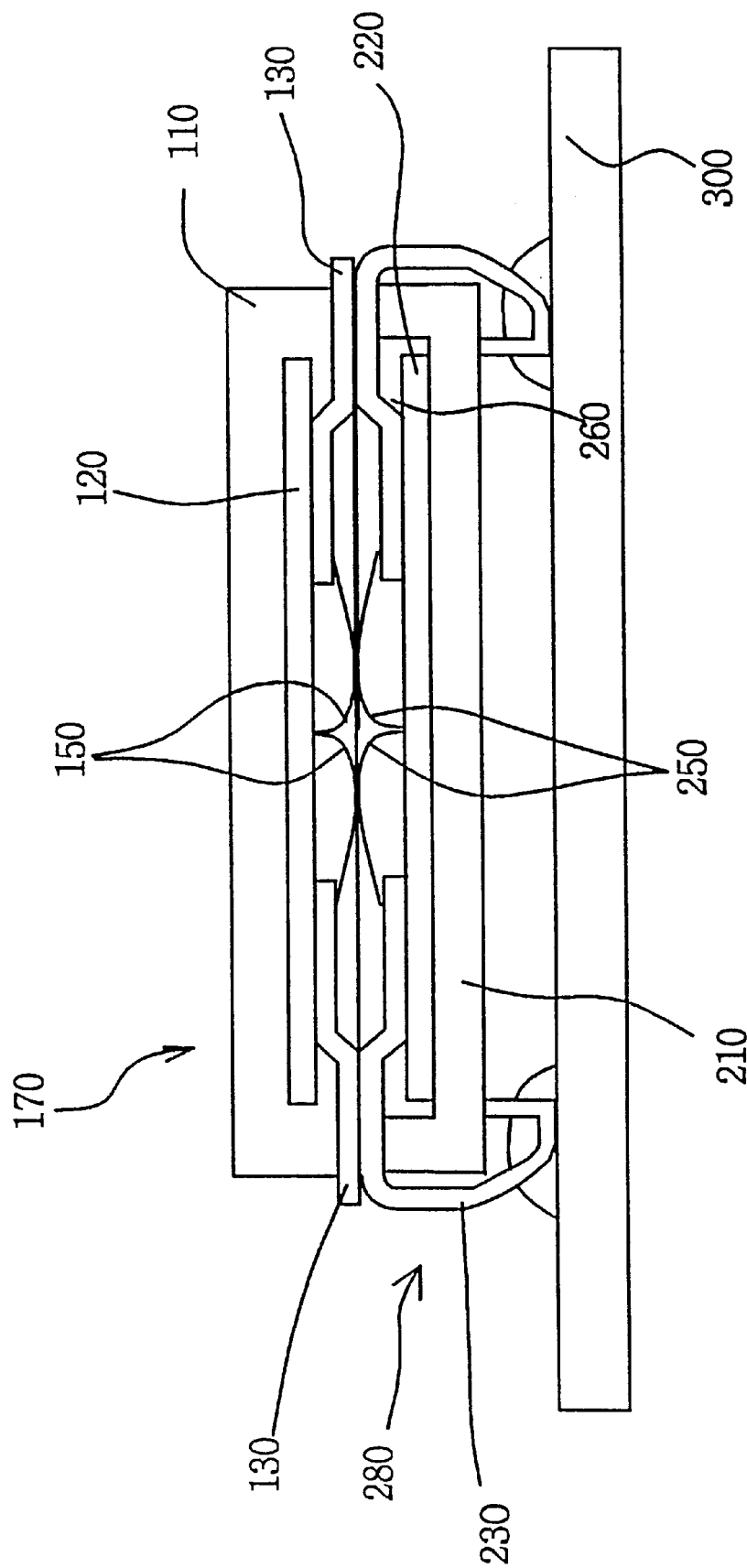

In FIG. 6D of the fourth embodiment according to the present invention, a BLP 280 including a premolded body 210 and having the tips of the leads 230 hooked inward like J is mounted on the printed circuit board 300 in the front state as an unit package, and a conventional BLP 170 is placed on the BLP 280 according to the present invention, wherein the front faces of the leads on the BLP 280 are contacted with the leads 130 of the conventional BLP 170 face to face.

Embodiment 5

Figure 6E:
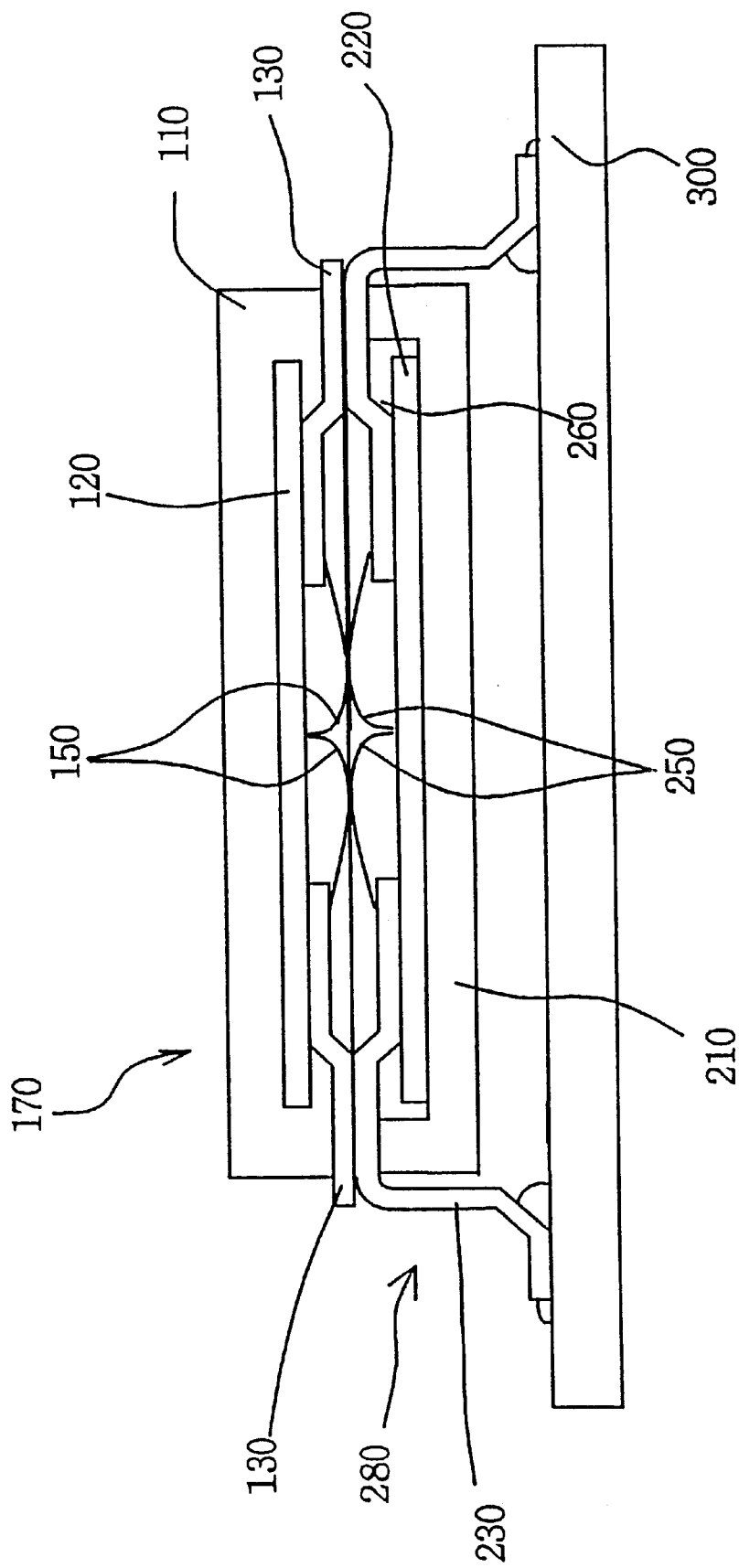

In FIG. 6E of the fifth embodiment according to the present invention, a BLP 280 including a premolded body 210 and having the tips of the leads 230 bent like a gulling type is mounted on the printed circuit board 300 as a unit package, and a conventional BLP 170 is placed on the BLP 280 having their leads contacted each other.

Embodiment 6

In FIG. 6F of the sixth embodiment according to the present invention, a BLP 280 including a premolded body 210 and having the tips of the outer leads 230 transformed into I type is fixed to a printed circuit board 300 and a conventional BLP 170 is stacked on the BLP 280, wherein the leads of each BLP are contacted reciprocally.

Embodiment 7

Figure 6G:
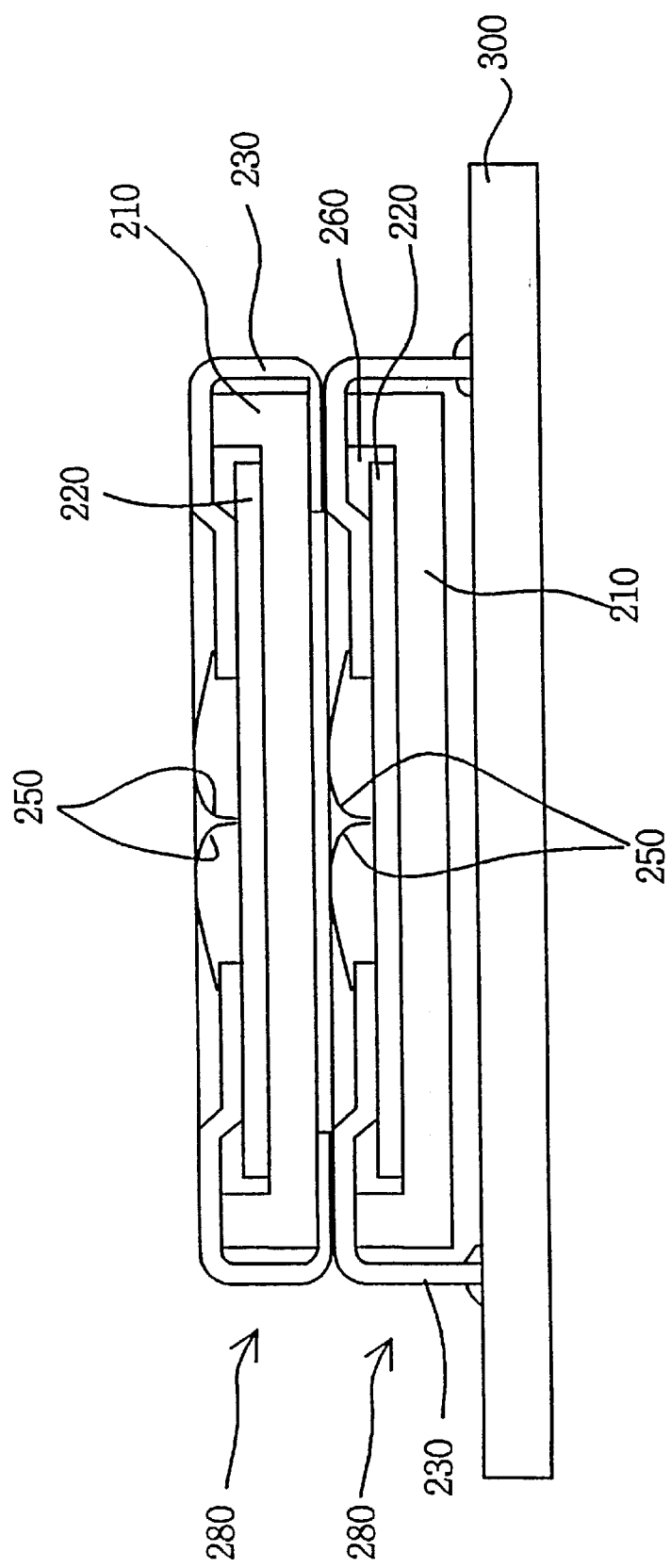
Figure 6H:
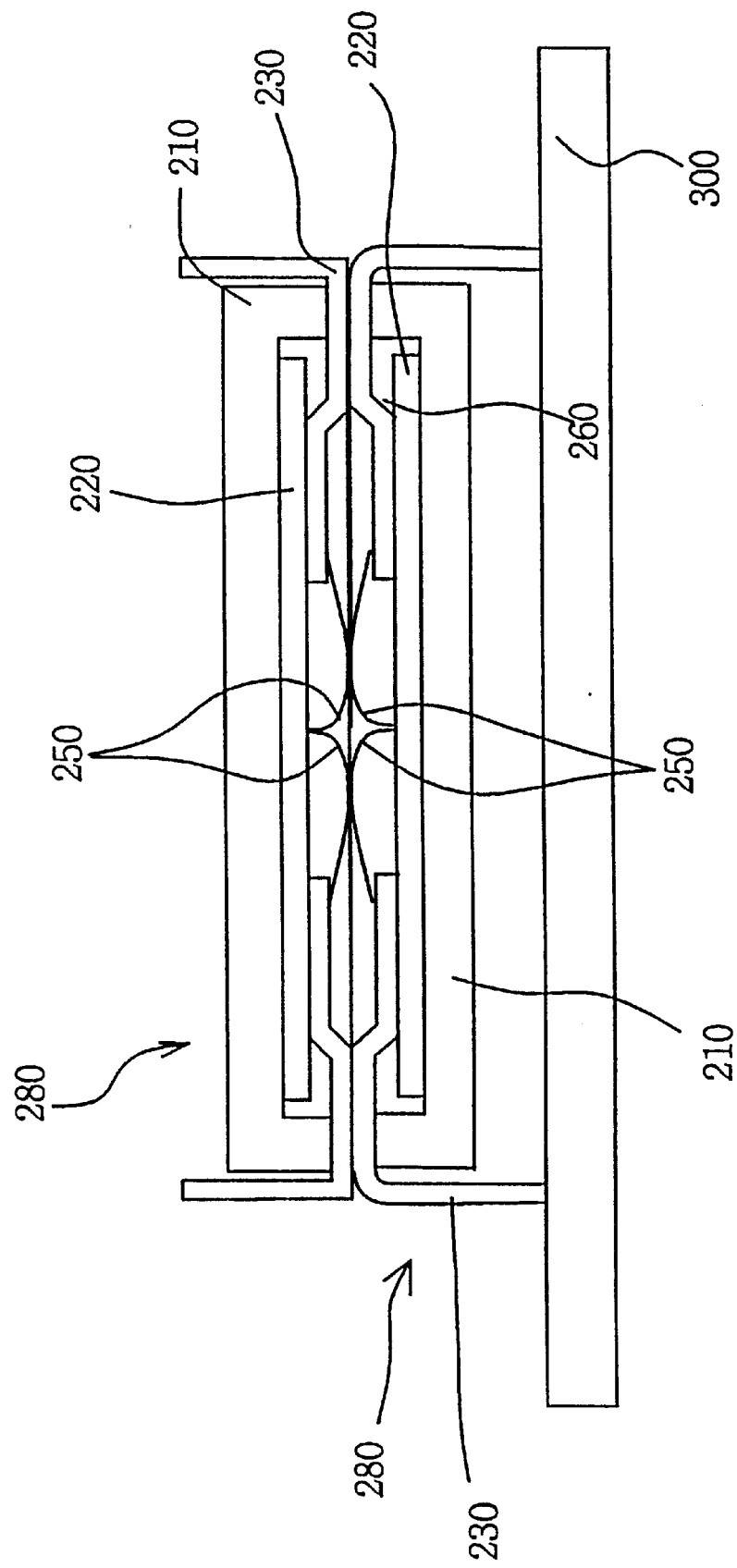

As is explained in embodiment 6, in FIG. 6G the BLP 280 in FIG. 4A is stacked on the different BLP 280 of FIG. 6F in the front state wherein the different BLP is mounted on the printed circuit 300, while in FIG. 6H the BLP 280 including a premolded body 210 and having the tips of the outer leads 230 transformed into I type is stacked on the BLP the same as the above BLP 280 in the reverse state wherein the BLP 280 is mounted on the printed circuit board 300 in the front state.

An embodiment having a molded part by means of forming uniformly both body and filled part will be explained for stacking the BLP according to the present invention.

Embodiment 8

Figure 7A:
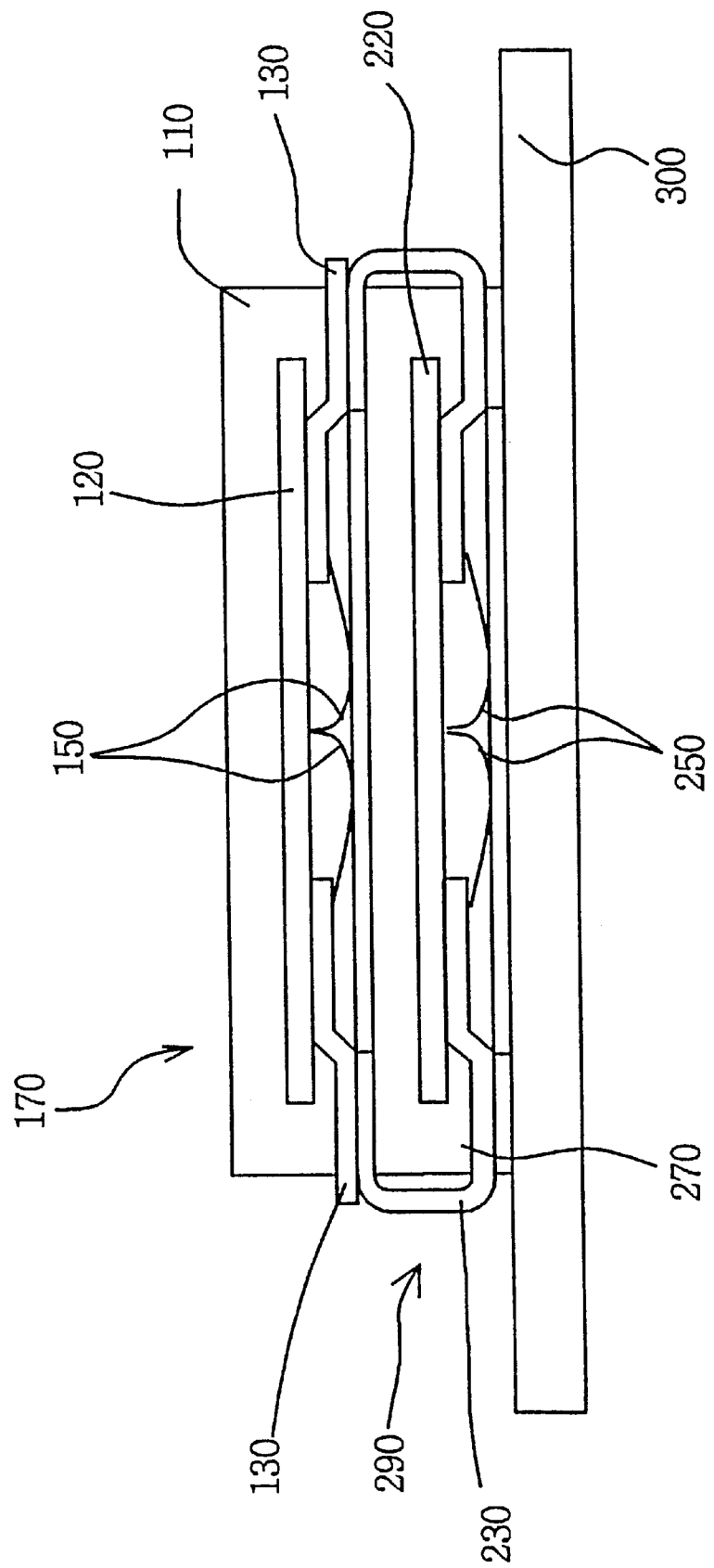

In FIG. 7A of the eighth embodiment, the conventional BLP 170 is placed on the BLP 290 according to the present invention which mounted on the printed circuit 300, wherein the back faces of the leads 230 in the BLP 290 are extended in the reversed state around the molded part 270 to the leads 130 of the conventional BLP 170 for connecting those leads 130, 230 each other, also to the printed circuit board 300 on which the BLP 290 is mounted, and the BLP 290 packaged in the manner of a conventional method is formed by means of extending the leads 290 from the front via the lateral to the back face of the molded part 270.

Embodiment 9

Figure 7B:
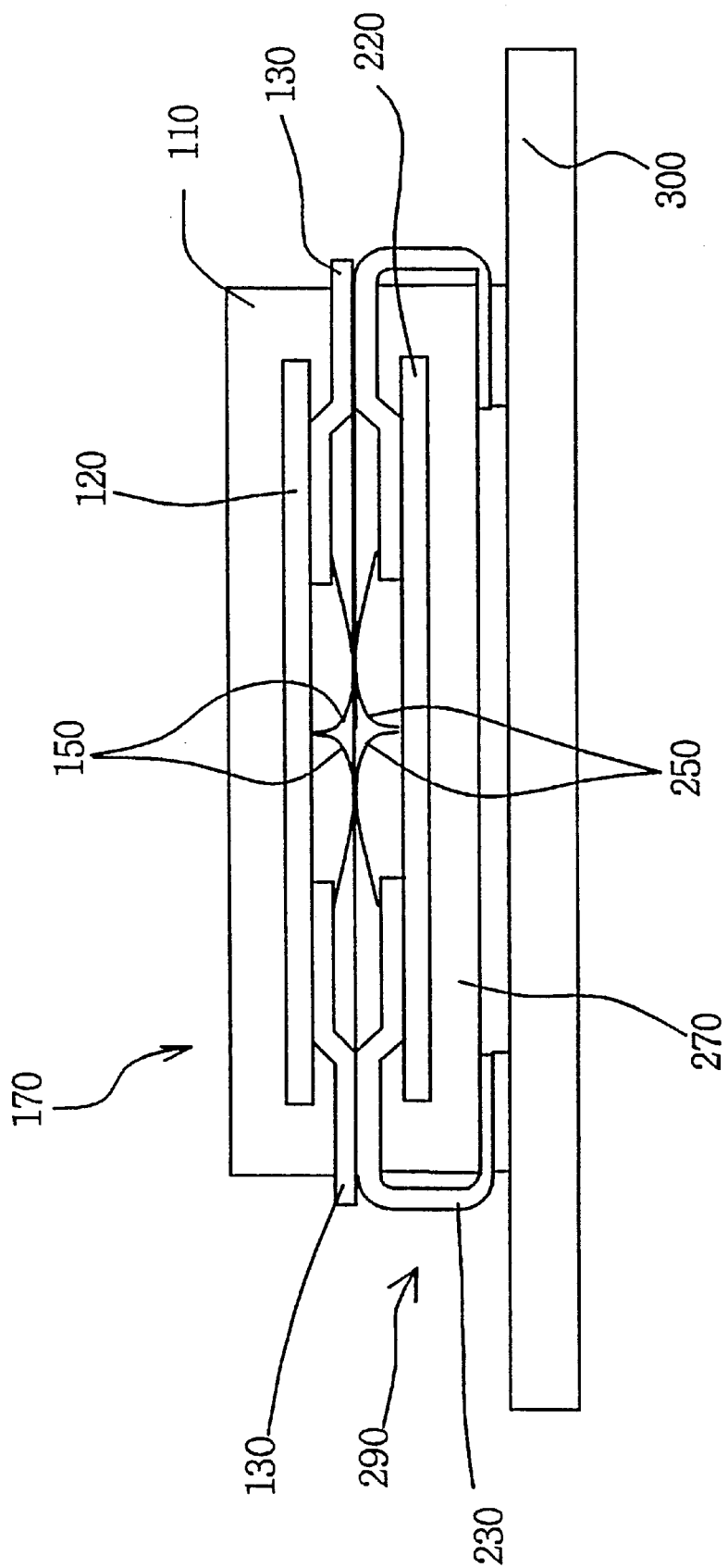

In FIG. 7B of the ninth embodiment, the BLP 290 is mounted on the printed circuit 300 in the front state and the conventional BLP 170 is stacked in the reversed state on the BLP 290, in which each lead is contacted face to face.

Embodiment 10

Figure 7C:
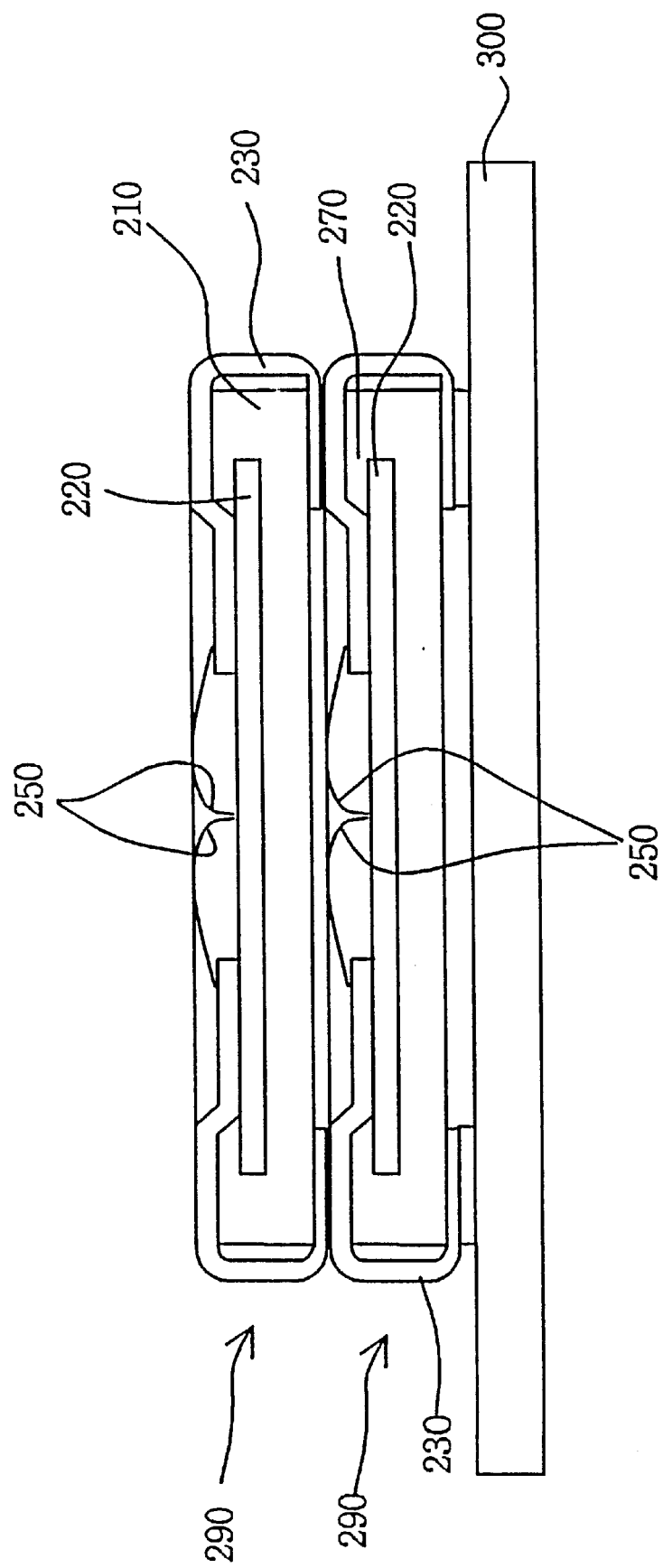

In FIG. 7C of the tenth embodiment, one BLP 290 is stacked on the other BLP 290 in the front state and the BLP's 290 can be stacked on themselves in the reversed state on their leads' being connected as well, wherein the leads 230 of each BLP 290 extended from the front via the lateral to the back face of the molded part 270 have reciprocal tight contacts face to face.

Embodiment 11

Figure 7D:
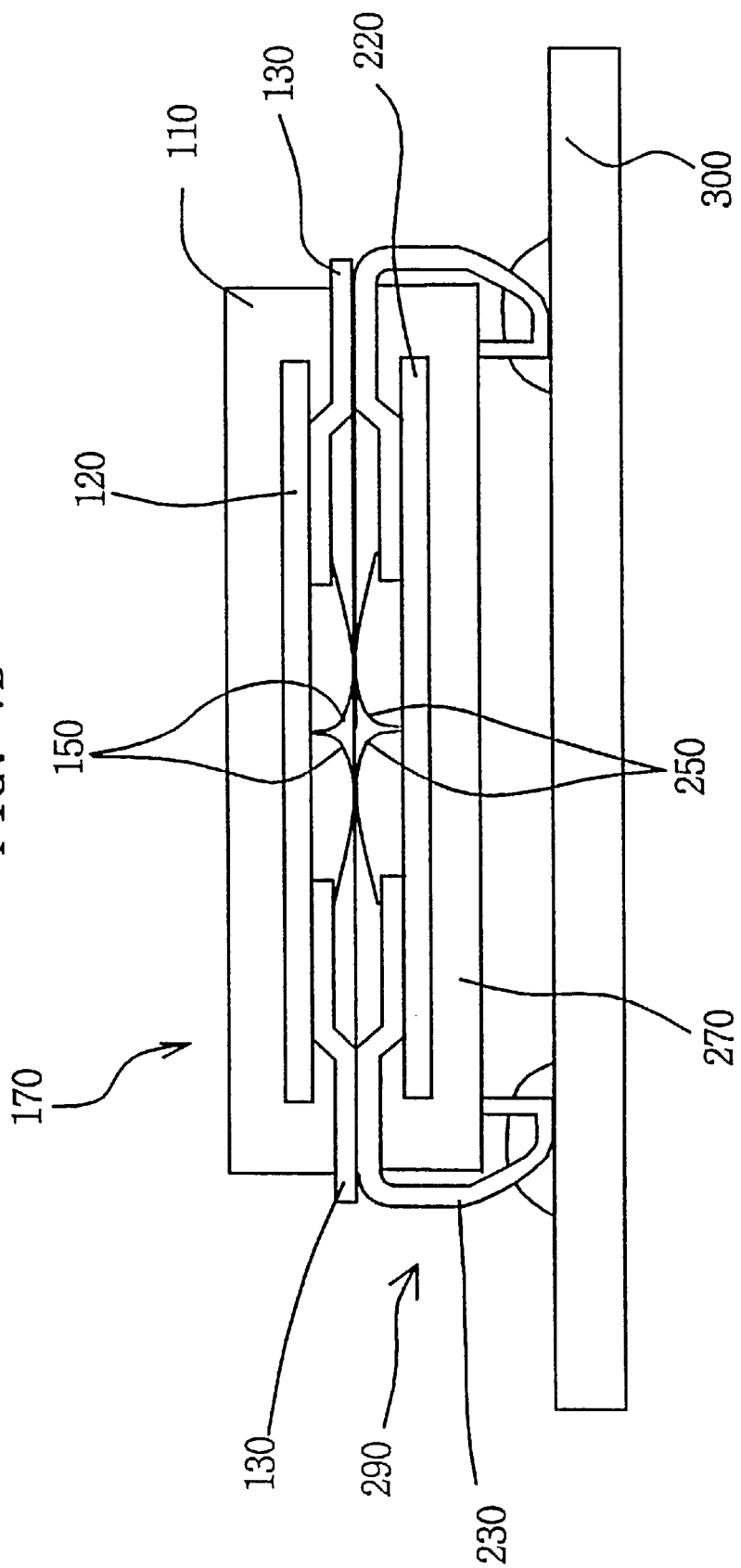

In FIG. 7D of the 11th embodiment, the BLP 290 including the leads 230 extended along with the molded part 270 and having the tips of the leads 230 hooked like J is mounted on the printed circuit board 300 in the front state, in which the conventional BLP is stacked on the BLP 290 according to the present invention and the front faces of the leads 230 in the BLP 290 are contacted with the leads 130 of the conventional BLP 170 face to face. Mounted on the printed circuit, the BLP 290 having J typed tips of the leads provides an improved soldering effect.

Embodiment 12

In FIG. 7E of the 12th embodiment, the BLP 290 including the leads 230 extended from the front face of the molded part 270 via the lateral faces of the molded part 270 and having the tips of the leads 230 bent inward like a gulling type is mounted on the printed circuit 300 and the conventional BLP 170 is stacked on the BLP 290, wherein the leads of the BLP's are contacted reciprocally and the above tips are extended somewhat longer than the vertical length of the lateral face enough to have the gulling type.

Embodiment 13

Figure 7F:
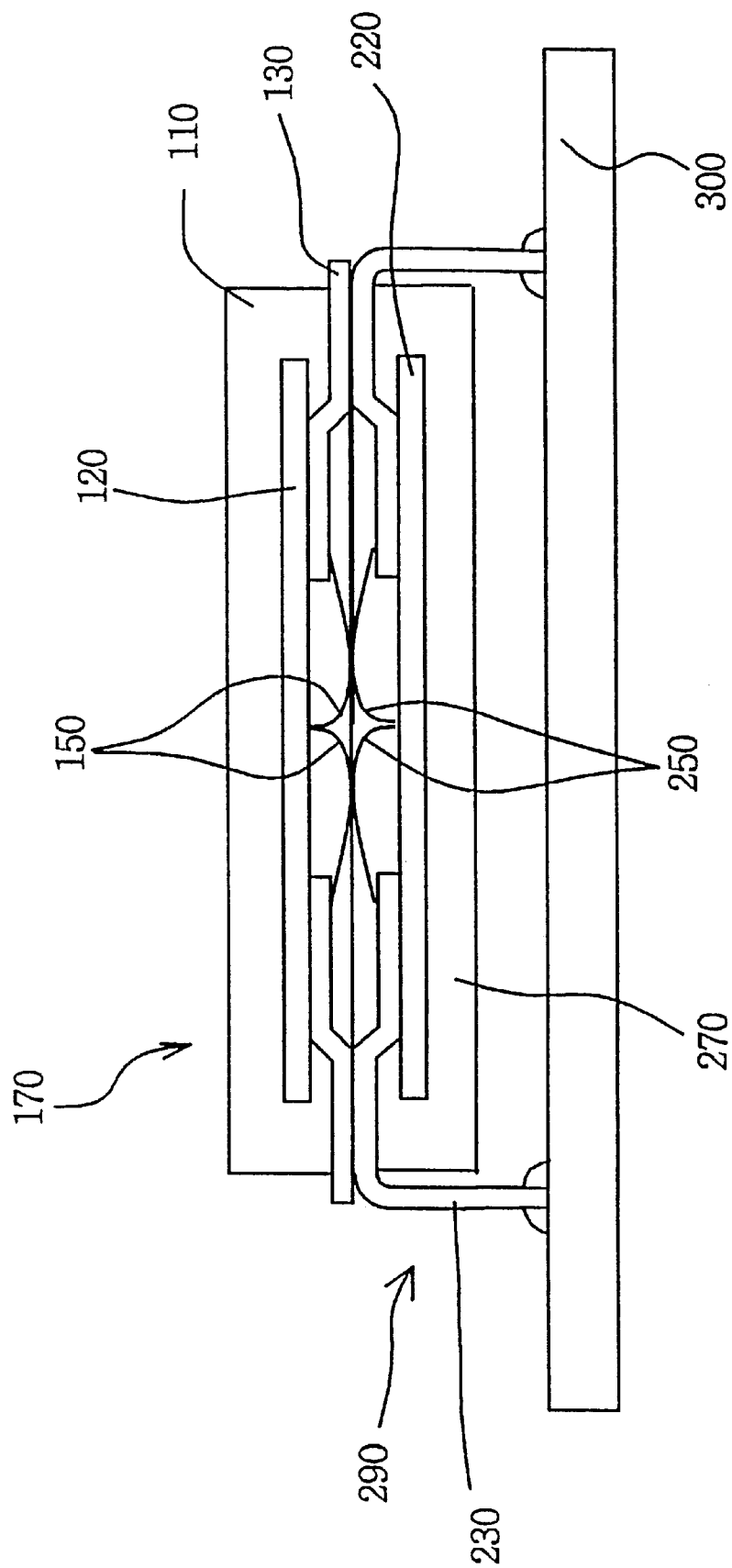

In FIG. 7F of the 13th embodiment, the conventional BLP 170 is stacked on the BLP 290 including the leads 230 extended from the front face of the molded part 270 via the lateral faces of the molded part 270 and having the tips of the leads 230 formed like I and fixed to the printed circuit 300, reciprocally connecting to the BLP 290 according to the present invention.

Embodiment 14

Figure 7G:
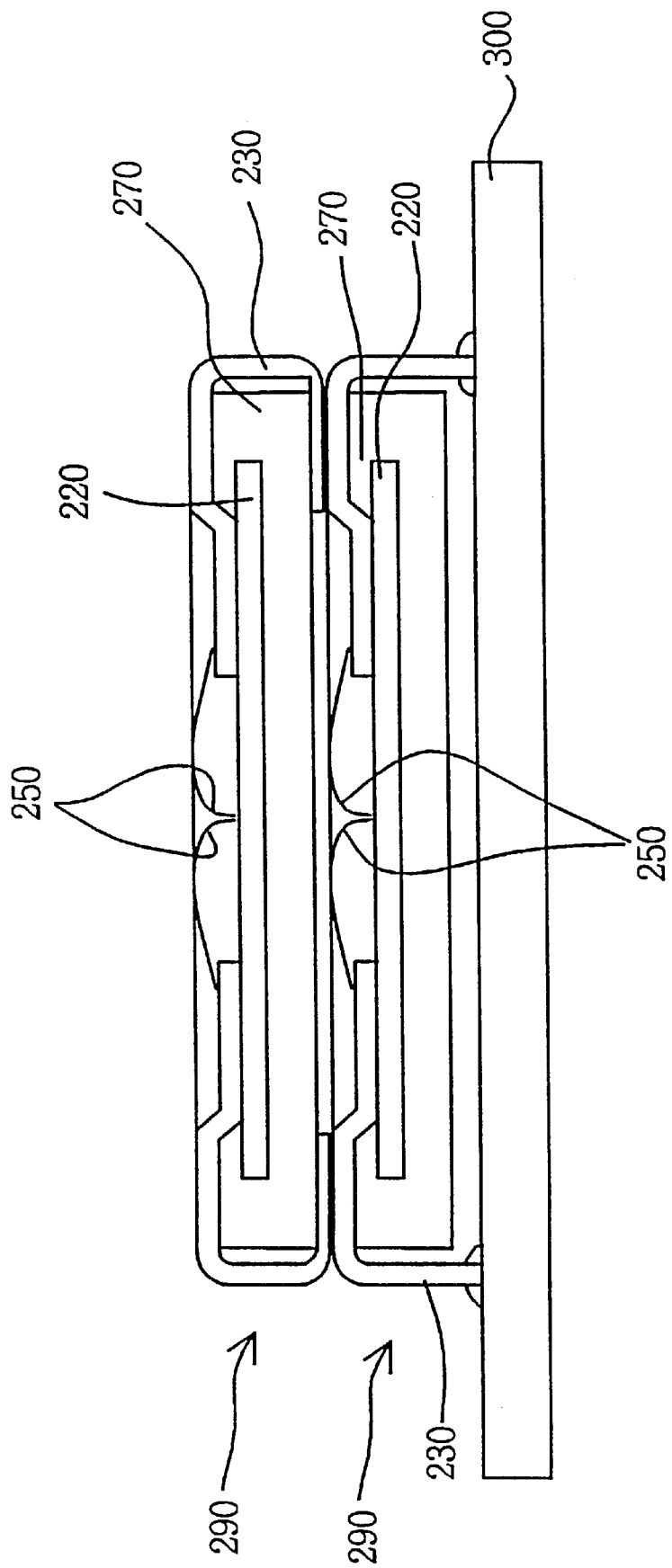
Figure 7H:
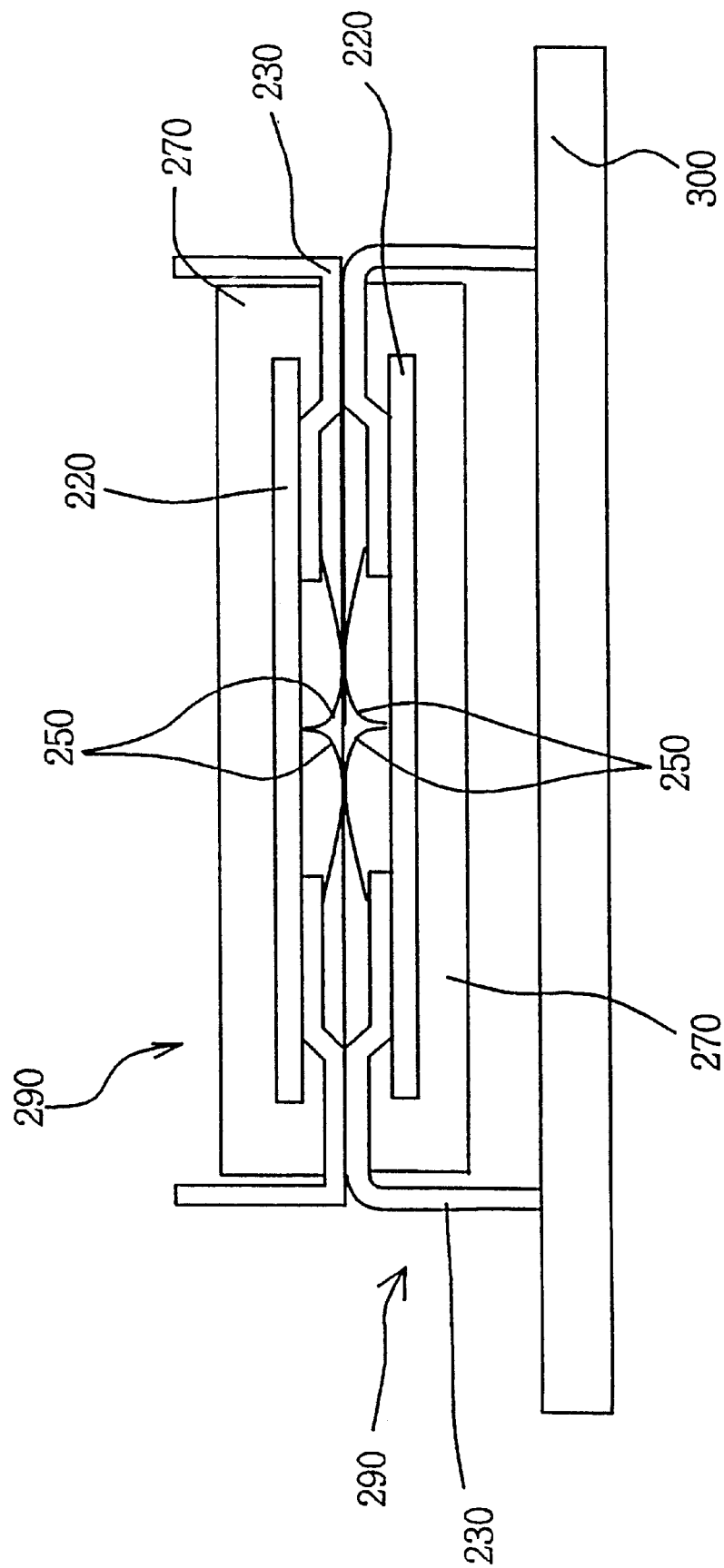

In FIG. 7G and FIG. 7H of the 14th embodiments, FIG. 7G shows that the BLP 290 shown in FIG. 4B is stacked in the front state on the BLP 290 having I typed tips of the leads 230 and being explained in FIG. 7F, while FIG. 7H shows that the BLP 290 having the I typed tips of the leads 230 shown in FIG. 7F is mounted on the printed circuit board 300 and the identical BLP 290 is stacked on the above BLP 290 in the reversed state. And the leads 230 in the above two cases are connected reciprocally.

Figure 8:
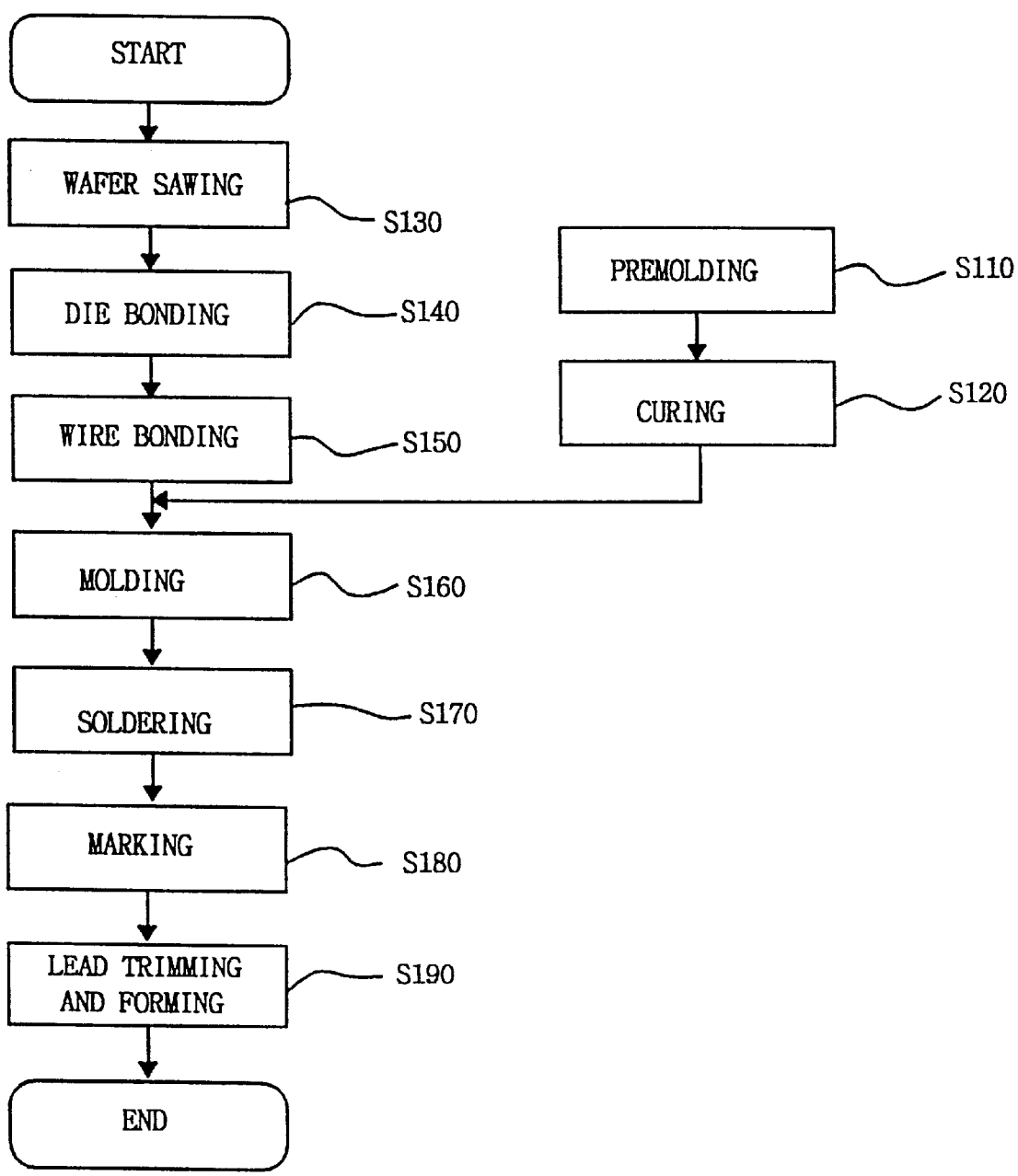
FIG. 8 shows a flow chart of a method for fabricating BLP typed semiconductor packages according to the present invention.

FIG. 8 shows a flow chart for a method of fabricating semiconductor package according to the present invention.

The method of fabricating semiconductor package comprises premolding S110 a body having a space for embracing a chip and leads by means of inserting resin into a mold and independently hardening S120 the body having been premolded, separating S130 a wafer into a plurality of chips by cutting the wafer in which a plurality of chips have been formed, bonding the separated chip to a paddle that is a die-bonding step S140, connecting a plurality of input/output pads to the leads in order to connect the leads electrically to the chip in use of bonding wires that is a wire-bonding step S150, independently molding S160 the inner space having been premolded, including the wire-bonded chip and leads and into which a filler has been inserted, plating S180 outer leads with protecting material wherein the outer leads are disclosed after the molded state of the package, marking S180 a surface of the body with identification factors, eliminating unnecessary part of the outer leads and bending the remaining outer leads to adhere closely to the outer surface of the body that are the lead-trimming and forming S190.

Another method of fabricating semiconductor package according to the present invention provides a modified BLP 290, including the steps of forming a molded part 270 by means of a transfer molding that forms uniformly both body 210 and filled part 260, extending the leads 230 through the front face of the molded part 270 and the back face of the molded part 270 via the lateral faces of the molded part 270, and bending the leads 230 to be set tight to the faces of the molded part 270.

Another method of fabricating BLP according to the present invention is as below.

After a wafer including a plurality of chips that has a plurality of input/output pads has been separated into each chip, leads are coupled with the chip by means of fixing a plurality of the leads to the specific portions of the separated chip.

And then, a wire-bonding is executed with bonding wires in order to connect electrically a plurality of the leads with a plurality of the input/output pads, after which a molded part is formed by means of forming a shape embracing the wire-bonded chip and the portion of the leads in use of epoxy resin.

After the molded part has been formed, a plurality of the leads are trimmed.

Finally, a BLP according to the present invention is fabricated by means of a forming step which is bending the disclosed portions of the leads out of the molded part along with the lateral faces of the molded part.

As is said in the above explanation, the present invention provides a shortened processing time and a decreased solder fatigue, wherein the processing time is shortened by means of an independent process for forming a premolded body and the solder fatigue is decreased effectively by means of a plenty of the disclosed portions of the leads emitting the heat to the surroundings during the heat transfer.

Moreover, the semiconductor packages are able to be mounted on the printed circuit either in the front state or in the reversed state.

Also provided are a minimized area and height required for stacking semiconductor packages by means of elongating the leads around the portion of the body of the semiconductor package to increase contacting areas face to face, and choices for stacking semiconductor packages having a variety of the lead types.

The foregoing embodiments are merely exemplary and are not to be construed as limiting the present invention. The present teaching can be readily applied to other types of apparatuses. The description of the present invention is intended to be illustrative, and not to limit the scope of the claims. Many alternatives, modifications, and variations will be apparent to those skilled in the art.

What is claimed is:

1. A semiconductor package comprising:
   a chip having a plurality of pads;
   a body having a first face opposite to a second face and enveloping said chip; and
   a plurality of leads, each having first and second ends, wherein said first ends of said leads are connected to said pads, said leads being shaped so that said second ends of said leads contact said second face, said second ends of said leads being shaped substantially into an "I" shape.

2. The semiconductor package according to claim 1, wherein said material is an insulating adhesive.

3. The semiconductor package according to claim 1, wherein said leads are connected electrically with a plurality of said pads via wires.

4. The semiconductor package according to claim 1, wherein said body comprises a recess comprising a premolded part, and a filling part filling said recess.

5. A structure of semiconductor packages comprising:
   first and second package bodies, each having a first face disposed opposite to a second face;
   first and second chips each having a plurality of pads and encompassed respectively by said first and second package bodies; and
   a plurality of leads, each having first and second ends, the first end being connected to one of said chip pads, wherein said leads of at least one of said first and second package bodies are shaped so that said second ends of said leads contact said second face of said respective package body and said second ends of said each lead of said first package body is shaped substantially into an "I" shape.

6. The semiconductor packages according to claim 5, wherein a plurality of said second package bodies connected electrically to one another are stacked on said first package bodies.

7. The semiconductor packages according to claim 5, wherein said second package body is stacked onto said front face of said body of said first package body.

8. The semiconductor packages according to claim 7, further comprising a plurality of second package bodies, wherein said second package bodies are stacked onto said second face of said first package body.

9. A semiconductor package comprising:
   a chip having a plurality of pads;
   a body having a first face opposite to a second face and enveloping said chip; and
   a plurality of leads, each having first and second ends, wherein said first ends of said leads are connected to said pads, said leads being shaped so that said second ends of said leads contact said second face, said second ends of said leads being shaped substantially into a gulling shape.

10. A structure of semiconductor packages comprising:

first and second package bodies, each having a first face disposed opposite to a second face;

first and second chips each having a plurality of pads and encompassed respectively by said first and second package bodies; and a plurality of leads, each having first and second ends, the first end being connected to one of said chip pads, wherein said leads of at least one of said first and second package bodies are shaped so that said second ends of said leads contact said second face of said respective package body and said second end of said each lead of said first package body is shaped substantially into a gulling shape.

11. The semiconductor package according to claim 1, further comprising a material attaching said lead to said chip.

12. The semiconductor package according to claim 9, further comprising a material attaching said lead to said chip.

13. The semiconductor package according to claim 5, further comprising a material attaching said leads to said chip in each said body.

14. The semiconductor package according to claim 10, further comprising a material attaching said leads to said chip in each said body.

* * * * *